(12) United States Patent
Kitamura et al.

(10) Patent No.: US 8,163,467 B2
(45) Date of Patent: Apr. 24, 2012

(54) DUMMY LIGHT-EXPOSED SUBSTRATE, METHOD OF MANUFACTURING THE SAME, IMMERSION EXPOSURE APPARATUS, AND DEVICE MANUFACTURING METHOD

(75) Inventors: Tsuyoshi Kitamura, Kawachi-gun (JP); Nobuhiko Yabu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 412 days.

(21) Appl. No.: 12/479,636

(22) Filed: Jun. 5, 2009

(65) Prior Publication Data

US 2009/0305149 A1 Dec. 10, 2009

(30) Foreign Application Priority Data

Jun. 9, 2008 (JP) .................................. 2008-150842

(51) Int. Cl.
*G03F 7/20* (2006.01)
*G03B 27/52* (2006.01)
(52) U.S. Cl. ................. 430/325; 430/5; 355/27; 355/55
(58) Field of Classification Search .............. 430/5, 325; 355/30, 55, 27
See application file for complete search history.

(56) References Cited

U.S. PATENT DOCUMENTS

| 2006/0187432 A1 | 8/2006 | Yasuda et al. | |
| 2007/0147831 A1 | 6/2007 | Kaneyama et al. | |
| 2007/0263182 A1 * | 11/2007 | Nakano et al. | 355/30 |
| 2009/0066922 A1 | 3/2009 | Nakano | |
| 2009/0323035 A1 * | 12/2009 | Fujiwara | 355/53 |

FOREIGN PATENT DOCUMENTS

| JP | 2005-268747 A | 9/2005 |
| JP | 2007-173732 A | 7/2007 |
| JP | 2007-235112 A | 9/2007 |
| JP | 2008-283156 A | 11/2008 |
| KR | 10-2007-0048164 A | 5/2007 |
| KR | 10-2008-0026082 A | 3/2008 |
| WO | WO 2007135990 A1 * | 11/2007 |

* cited by examiner

*Primary Examiner* — Shean Wu
(74) *Attorney, Agent, or Firm* — Canon U.S.A., Inc. IP Division

(57) ABSTRACT

A dummy light-exposed substrate used for dummy light-exposure in an immersion exposure apparatus which exposes a substrate to light via a projection optical system and a liquid, comprises a lyophilic region, and a liquid repellent region surrounding the lyophilic region.

5 Claims, 6 Drawing Sheets

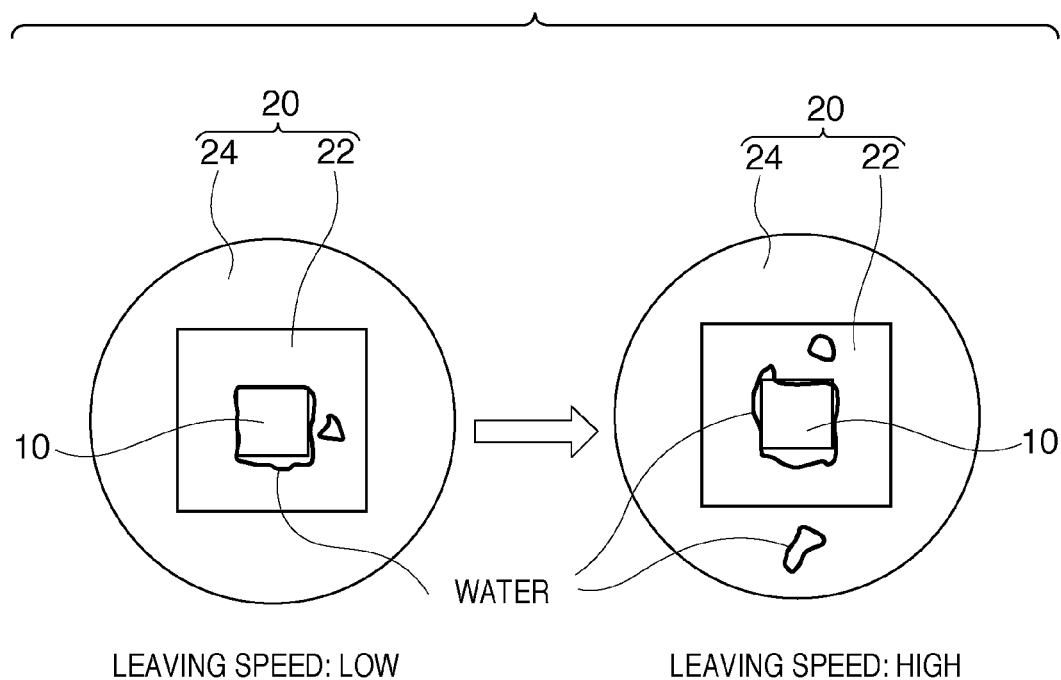
F I G. 3

DUMMY LIGHT-EXPOSED SUBSTRATE, METHOD OF MANUFACTURING THE SAME, IMMERSION EXPOSURE APPARATUS, AND DEVICE MANUFACTURING METHOD

BACKGROUND OF THE INVENTION

1. Field of the Invention

The present invention relates to a dummy light-exposed substrate and a method of manufacturing the same used in an immersion exposure apparatus, an immersion exposure apparatus, and a device manufacturing method.

2. Description of the Related Art

An exposure apparatus which reduces and projects a pattern formed on an original (also called a mask or a reticle) onto a substrate by a projection optical system to expose the substrate to light has been conventionally used in the process of manufacturing a semiconductor device, having an ultrafine pattern formed, such as an LSI.

Along with an improvement in the integration density of semiconductor devices, further advances in micropatterning are required, leading to a growing demand for a higher resolving power of the exposure apparatus along with the development of the resist process.

To improve the resolving power of the exposure apparatus, there are an approach of shortening the wavelength of the exposure light, and an approach of increasing the numerical aperture (NA) of the projection optical system. As the resolving power is improved in this way, the depth of focus of the projection optical system decreases, so it is important to improve the focus accuracy of focusing the substrate (wafer) on the image plane of the projection optical system.

Also, one of evaluation items for the exposure apparatus is the alignment accuracy of precisely overlaying various patterns, and a factor which adversely affects the alignment accuracy is a magnification error of the projection optical system. The patterns of semiconductor devices are increasingly becoming finer each year. To keep up with this trend, a need for improving the alignment accuracy is soaring. It is therefore very important to maintain the projection optical system at a predetermined magnification throughout the light exposure process.

The projection optical system naturally absorbs a certain component of the exposure light energy, thus changing the temperatures of optical elements which constitute the projection optical system. Changes in the temperatures of the optical elements vary the optical characteristics, such as the refractive indices, of the optical elements.

When the projection optical system continues to be irradiated with exposure light over a long period of time, the imaging performance (e.g., the focus, magnification, distortion aberration, astigmatism, and other wavefront aberrations) of the projection optical system fluctuates. This may result in the generation of aberrations by amounts that are non-negligible from the viewpoint of ensuring high focus and alignment accuracies.

Under the circumstances, a method of correcting fluctuations in imaging characteristics which depend on the state in which the projection optical system is irradiated with exposure light has been proposed. In one example, the amounts of fluctuations in imaging characteristics which depend on the state in which the projection optical system is irradiated with exposure light are calculated using a model equation which uses, for example, the exposure light amount, light exposure time, and non-light-exposure time as variables, and the fluctuations in the imaging characteristics of the projection optical system are corrected based on the calculation results.

A model equation as described above can serve to correct fluctuations in the imaging characteristics of the projection optical system as long as the model equation has a coefficient for each imaging characteristic of the projection optical system and the coefficients are measured experimentally.

In the experiment for measuring the coefficients, there is no need to transfer a certain pattern on a substrate coated with a photoresist. For this reason, in the experiment for measuring the coefficients, a dummy light-exposed substrate placed on the substrate stage is irradiated with light in place of a substrate coated with a photoresist. Such light irradiation for a purpose other than light exposure as the original purpose can be called dummy light-exposure.

Nowadays, in order to achieve an actual increase in the numerical aperture (NA) of the projection optical system, an immersion exposure apparatus in which a liquid film is formed in the space between the projection optical system and the substrate and which exposes the substrate to light via the projection optical system and the liquid film has been realized. In the immersion exposure apparatus, the dummy light-exposed substrate must undergo dummy light-exposure while it is set in an immersion environment as well as the substrate used in the process. It is therefore convenient for the dummy light-exposed substrate to have a liquid repellent surface structure as well as the substrate used in the process. However, if the liquid repellent region is made of an organic substance, this substance decomposes upon being irradiated with excimer laser light while it is in contact with the liquid film. This makes it difficult to maintain the liquid repellency of the dummy light-exposed substrate in dummy light-exposure which requires a long period of time or a large number of times of light exposure.

A general inorganic substance which is expected to have resistance against excimer laser light is lyophilic. If the surface of the dummy light-exposed substrate is made of a lyophilic inorganic substance, the liquid film may stay behind on the surface, or the liquid may scatter depending on the leaving speed and/or transport speed of the dummy light-exposed substrate from the space beneath the projection optical system.

SUMMARY OF THE INVENTION

The present invention provides a technique advantageous to dummy light-exposure in immersion exposure.

According to one of the aspect of the present invention, there is provided a dummy light-exposed substrate used for dummy light-exposure in an immersion exposure apparatus which exposes a substrate to light via a projection optical system and a liquid, the dummy light-exposed substrate comprising a lyophilic region, and a liquid repellent region surrounding the lyophilic region.

According to the present invention, it is possible to provide a technique advantageous to dummy light-exposure in immersion exposure.

Further features of the present invention will become apparent from the following description of exemplary embodiments with reference to the attached drawings.

BRIEF DESCRIPTION OF THE DRAWINGS

FIG. 3 is a view schematically showing the relationship between the leaving speed of the dummy light-exposed substrate from an immersed region and a liquid residue;

DESCRIPTION OF THE EMBODIMENTS

Embodiments of the present invention will be described below with reference to the accompanying drawings.

Figure 1:
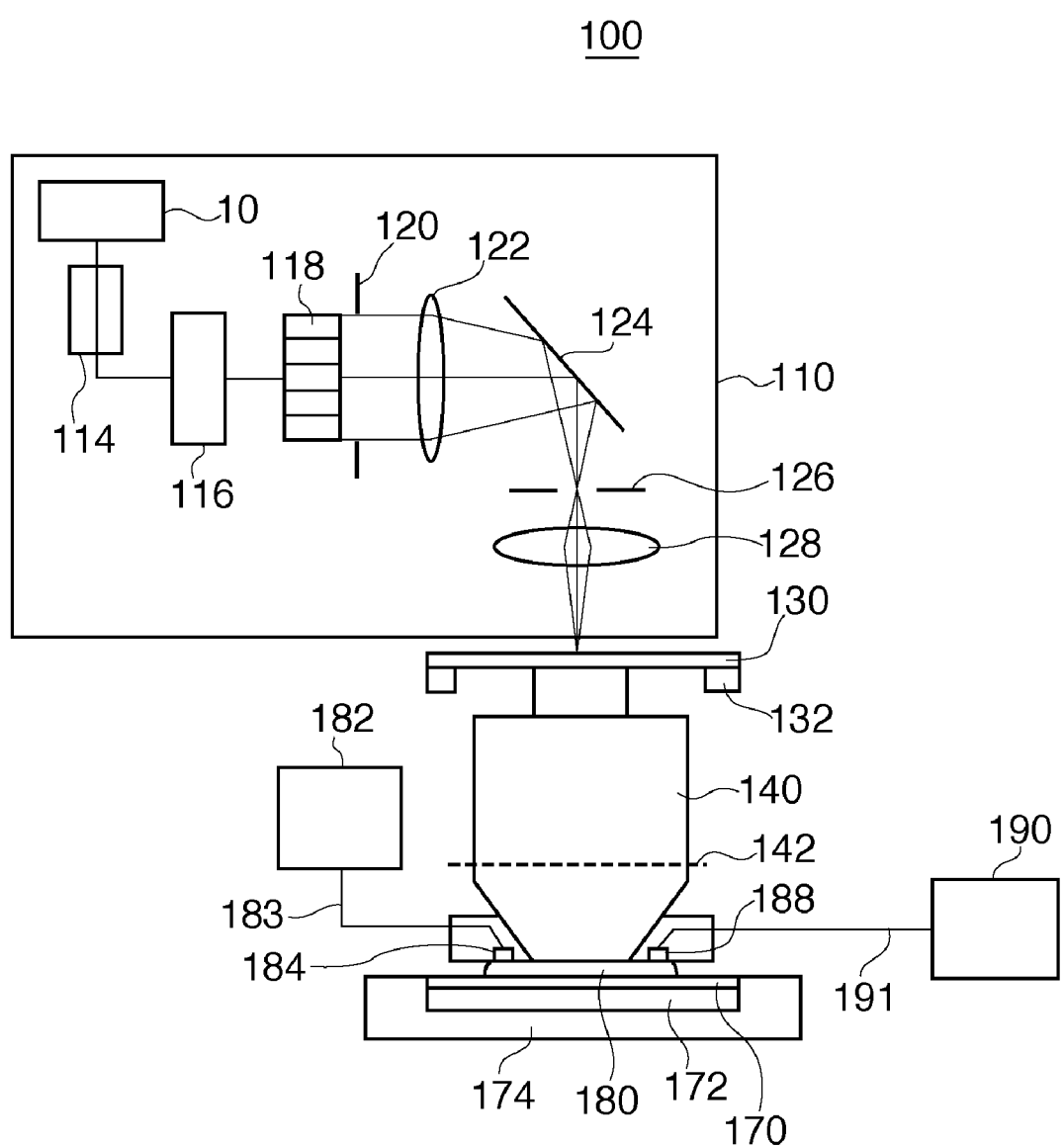
FIG. 1 is a view showing the schematic arrangement of an immersion exposure apparatus according to an embodiment of the present invention.

FIG. 1 is a view showing the schematic arrangement of an immersion exposure apparatus according to an embodiment of the present invention. An immersion exposure apparatus 100 according to an embodiment of the present invention is configured to project the pattern of an original 130 onto a substrate (e.g., a wafer) 170 via a projection optical system and a liquid (liquid film) 180 to expose the substrate 170 to light. The immersion exposure apparatus 100 may be configured as, for example, an exposure apparatus which exposes the substrate to light while scanning the original and the substrate, or an exposure apparatus which exposes the substrate to light while the original and the substrate stand still. The former apparatus can be called a scanning exposure apparatus or a scanner. The latter apparatus can be called a stepper.

The immersion exposure apparatus 100 can include, for example, an illumination optical system 110, original stage 132, projection optical system 140, substrate stage 174, liquid supply unit 182, and liquid recovery unit 190.

A pulsed laser 112 serving as a light source contains a gas such as KrF or ArF, and generates exposure light (laser light) by oscillation. The pulsed laser 112 generates exposure light having a wavelength of, for example, 193 nm in the far-ultraviolet region. The pulsed laser 112 can include a front mirror, narrow-band module, monitor module, and shutter. The front mirror constitutes a resonator. The narrow-band module includes a diffraction grating and prism for narrowing the exposure wavelength range. The monitor module includes a spectroscope and detector for monitoring the wavelength stability and the spectral width.

Exposure light emitted by the pulsed laser 112 is shaped into a predetermined size and shape upon passing through a beam shaping optical system 114 and a condensing optical system 116. After that, the shaped exposure light enters an optical integrator 118 to form a large number of secondary light sources on it in order to illuminate the original 130 with a uniform illuminance distribution.

The aperture of an aperture stop 120 of the illumination optical system 110 has a nearly circular shape, and a diameter (corresponding to the numerical aperture (NA) of the illumination optical system 110) set to a target value by an illumination system controller. The ratio of the numerical aperture of the illumination optical system 110 to that of the projection optical system 140 is called the coherence factor ($\sigma$ value). The illumination system controller can set the $\sigma$ value by controlling the aperture stop 120.

The exposure light having passed through the aperture stop 120 is converged by a condenser lens 122, is reflected by a mirror 124, and uniformly Kohler-illuminates the surface of a masking blade 126. The masking blade 126 is a stop having a variable aperture width to be able to change the pattern transferred region. The masking blade 126 sets the size of the pattern transferred region to match that of the exposure shot region. The exposure light having passed through the masking blade 126 illuminates the original 130 via an imaging lens 128.

The original 130 is also called a reticle or a mask. The original 130 has the pattern of a device such as a semiconductor device formed, and is illuminated by the illumination optical system 110. The projection optical system 140 reduces and projects the pattern of the original 130 onto the substrate (e.g., a wafer or a glass substrate) 170 at a reduction magnification $\beta$ ($\beta$ can be, for example, ¼). The substrate 170 is coated with a photoresist, and a latent image is formed on the photoresist by light exposure.

The projection optical system 140 can be, for example, an optical system including a plurality of lens elements alone. Alternatively, the projection optical system 140 can be an optical system including a plurality of lens elements and at least one concave mirror (catadioptric system). The projection optical system 140 can be, for example, an optical system including a plurality of lens elements and at least one diffractive optical element.

The original stage (reticle stage) 132 is driven by a driving mechanism (not shown) while holding the original 130. The original stage 132 and the projection optical system 140 can be supported by, for example, a support body supported through a damper or the like by a base frame installed on the floor or the like. The driving mechanism includes, for example, a linear motor and drives the original stage 132 in the X and Y directions to move the original 130.

The substrate 170 is held by the substrate stage 174 through a substrate chuck 172. The substrate stage 174 can move three-dimensionally, that is, can move in the optical axis direction of the projection optical system 140 (Z direction) and in a plane (in the X-Y plane) perpendicular to the optical axis direction.

The liquid 180 is supplied from the liquid supply unit 182 to the space between the projection optical system 140 and the substrate 170 through a supply pipe 183 and a supply nozzle 184. The liquid 180 is recovered by the liquid recovery unit 190 through a recovery nozzle 188 and a recovery pipe 191.

The configuration of a dummy light-exposed substrate and a method of manufacturing it according to the embodiment of the present invention will be explained next. The dummy light-exposed substrate is mounted on the substrate chuck 172 in place of a normal substrate (a substrate serving as a material to manufacture a device) in dummy light-exposure by an immersion exposure apparatus 100 as illustrated in FIG. 1.

Figure 2A:
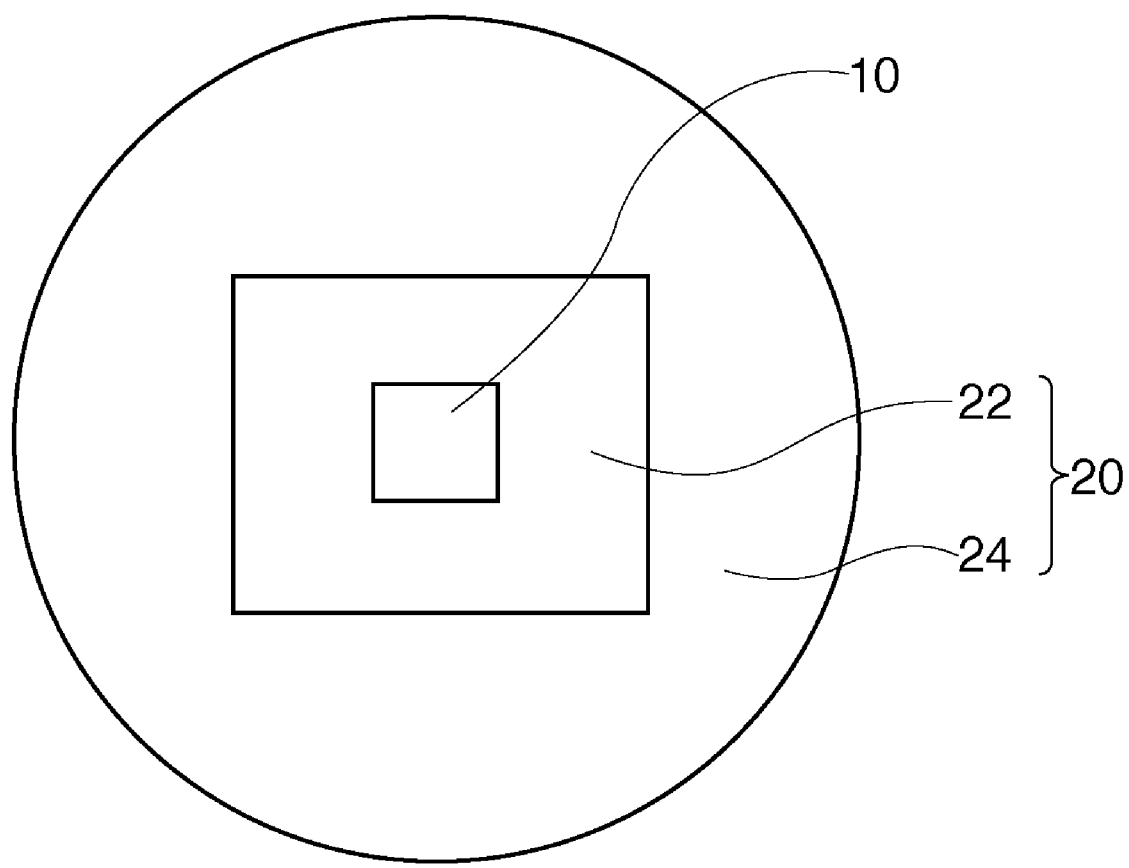
FIG. 2A is a view showing the configuration of a dummy light-exposed substrate or a dummy light-exposed member in the embodiment of the present invention.

FIG. 2A is a view showing the configuration of a dummy light-exposed substrate according to the embodiment of the present invention. A dummy light-exposed substrate 30 according to the embodiment of the present invention includes a lyophilic region 10 and a liquid repellent region 20 which surrounds the lyophilic region 10. The liquid repellent region 20 can include a first liquid repellent region 22 which surrounds the lyophilic region 10, and a second liquid repellent region 24 which surrounds the first liquid repellent region 22. Note that the second liquid repellent region 24 has a liquid repellency higher than the first liquid repellent region 22. The lyophilic region 10 can typically be made of an inorganic film, whereas the liquid repellent region 20 can typically be made of an organic film. More specifically, the first liquid repellent region 22 can be made of a hexamethyldisilane (HMDS) film, and the second liquid repellent region 24 can be made of a non-topcoated resist for immersion exposure. The dummy light-exposed substrate 30 having the structure shown in FIG.

2A exemplifies a dummy light-exposed substrate having a structure in which the central region is lyophilic and the liquid repellency increases toward the periphery.

A silicon wafer (silicon substrate) having an antireflection coating formed on its surface is preferable as the material of the dummy light-exposed substrate. The silicon wafer herein typically has the same shape as a silicon wafer serving as a material to manufacture a semiconductor device.

Figure 2B:
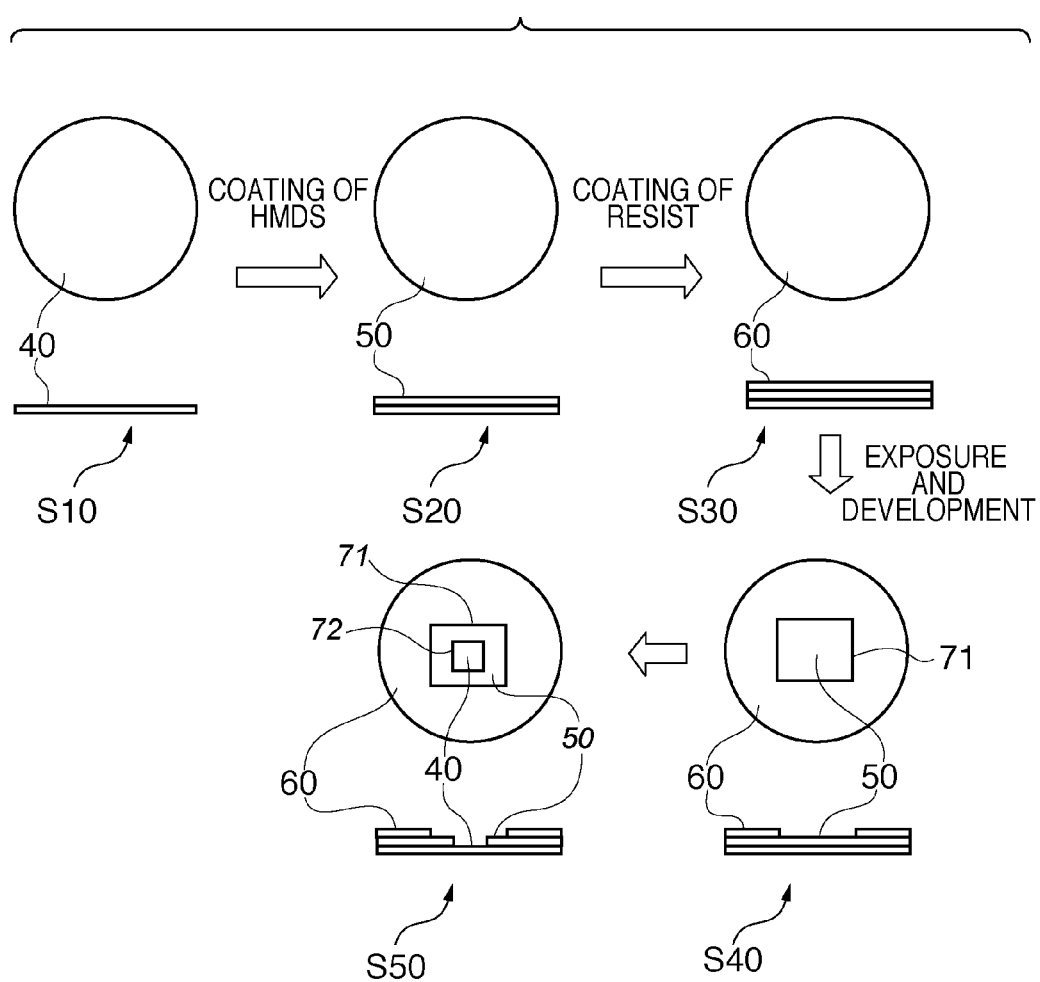
FIG. 2B is a diagram schematically showing a method of manufacturing a dummy light-exposed substrate.
Figure 4:
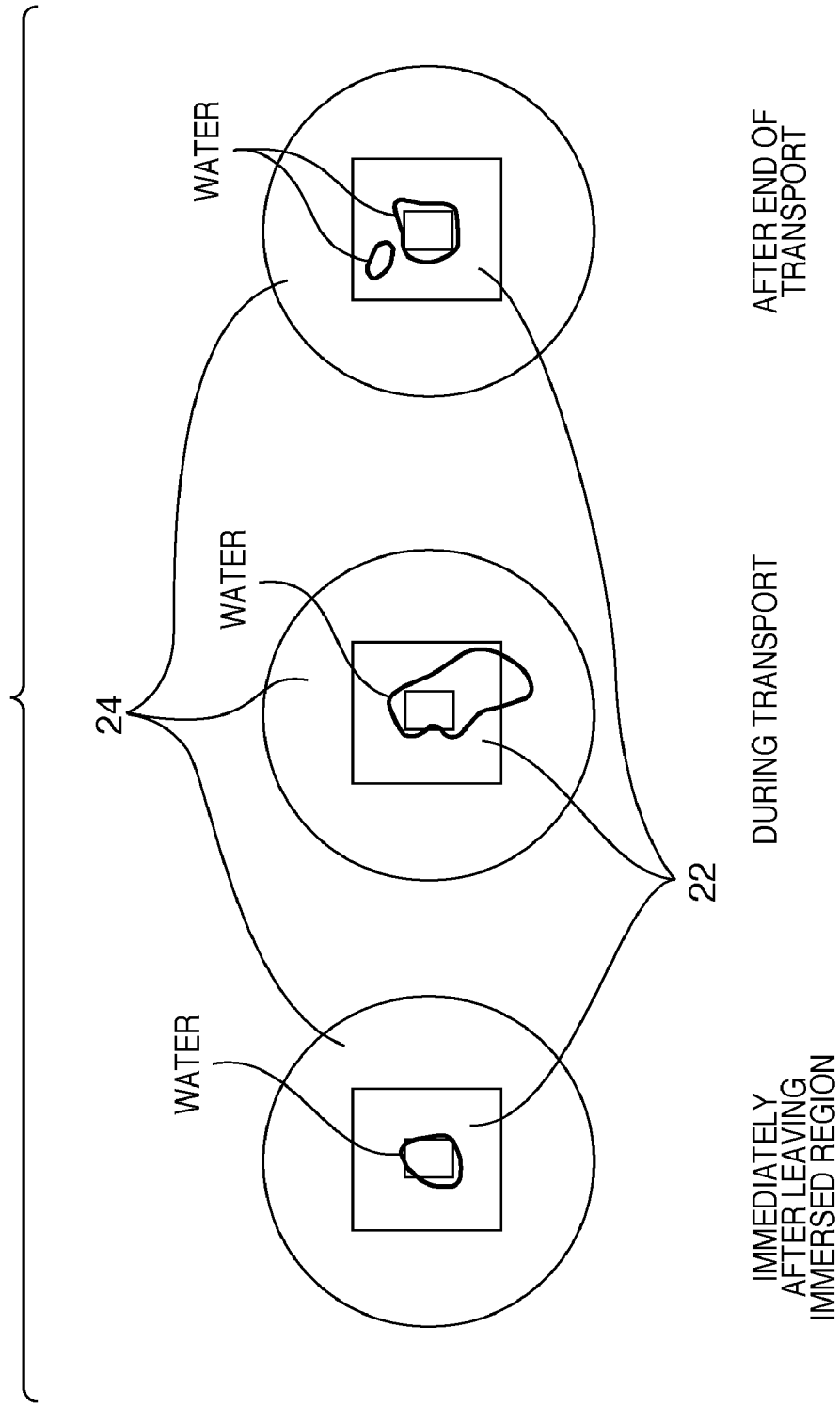
FIG. 4 is a view schematically showing the relationship between the transport speed of the dummy light-exposed substrate and a liquid residue.

FIG. 2B is a diagram schematically showing a method of manufacturing a dummy light-exposed substrate 30. First, in step S10, a silicon wafer (silicon substrate) 40 is prepared as a base member having an antireflection coating formed on its surface. Note that an antireflection coating can have, for example, a multilayer structure in which silicon oxide films and silicon nitride films are stacked. The static contact angle of the antireflection coating is typically 26°.

In step S20, a hexamethyldisilane (HMDS) film 50 is formed on the antireflection coating of the silicon wafer (silicon substrate) 40 as a first liquid repellent film. HMDS is a liquid repellent inorganic substance. The static contact angle of the HMDS film is 66°.

In step S30, a resist film 60 is formed on the HMDS film 50 as a second liquid repellent film having a liquid repellency higher than the HMDS film 50. A preferable example of the resist film 60 is a non-topcoated resist for immersion exposure. The static contact angle of the non-topcoated resist is typically larger than 90°.

In step S40, a first opening 71 whose boundary is defined by a closed figure is formed in the resist film 60 by lithography including light exposure and development to partially expose the HMDS film 50. Note that the first opening 71 (the exposed portion of the HMDS film 50) preferably has a shape stretching over the light-exposed region in dummy light-exposure (this region preferably has the same shape as the light-exposed region in normal light exposure). Typically, the light-exposed region in dummy light-exposure can have a rectangular shape as in normal light exposure, and the first opening 71 can have a rectangular shape stretching over the light-exposed region in dummy light-exposure.

Lastly, in step S50, a second opening 72 whose boundary is defined by a closed figure is formed in the first opening 71 in the exposed portion of the HMDS film 50 to partially expose the antireflection coating formed on the surface of the silicon wafer 40. A lyophilic region 10 is formed on the exposed portion of the antireflection coating. Note that a second opening 72 can be formed by mounting the structure obtained in step S40 on a substrate chuck of an immersion exposure apparatus as illustrated in FIG. 1, and exposing the structure to light while a liquid film is formed between the structure and a projection optical system (immersed state). The exposed portion of the HMDS film 50 can be decomposed and dissolved in the liquid film, thereby being removed. The second opening 72 (the exposed portion of the antireflection coating on the silicon wafer 40) preferably has a shape stretching over the light-exposed region in dummy light-exposure. Typically, the light-exposed region in dummy light-exposure can have a rectangular shape as in normal light exposure, and the second opening 72 can have a rectangular shape stretching over the light-exposed region in dummy light-exposure.

The exposed portion of the HMDS film 50 forms a first liquid repellent region 22, and the resist film 60 forms a second liquid repellent region 24. In other words, a first opening 71 and a second opening 72 are formed such that the resist film 60 which forms a second liquid repellent region 24 surrounds the exposed portion of the HMDS film 50 which forms a first liquid repellent region 22.

The shape of the first opening 71 is preferably determined to stretch over the flare light incident range in dummy light-exposure. This is to prevent the resist film from deteriorating upon being irradiated with flare light and exposed to light in dummy light-exposure. In one example, the first opening 71 is a 104 mm×99 mm rectangle.

The second opening 72 is defined inside the first opening 71. In one example, the second opening 72 is a 26 mm×33 mm rectangle, and can be formed by light exposure of 700 J×1,000 shots (100 times with an exposure amount of 700 J).

The liquid repellent material may be poly-paraxylene as described in Japanese Patent Laid-Open No. 2007-235112.

The dummy light-exposed substrate 30 can be mounted on a substrate chuck 172 of an immersion exposure apparatus 100 as illustrated in FIG. 1, and undergo dummy light-exposure. The lyophilic region 10 on the dummy light-exposed substrate 30 or its inner region can undergo dummy light-exposure as the light-exposed region. This is because an organic film as the typical material of the liquid repellent region may be decomposed by excimer laser light (exposure light) in an immersed state.

Dummy light-exposure can be performed in order to, for example, predict fluctuations in the imaging characteristics of the projection optical system, or stabilize the transmittances of lens elements which constitute the projection optical system. Dummy light-exposure can be performed in an immersed state because it must be performed under the same conditions as normal substrate light exposure conditions used to manufacture a device.

In dummy light-exposure for predicting fluctuations in the imaging characteristics of the projection optical system during light exposure in device manufacture, it is necessary to reproduce the thermal state of the projection optical system in device manufacture. To reproduce the thermal state in device manufacture, the dummy light-exposed substrate must have the same reflectance characteristic as the substrate in device manufacture. Also, to stabilize the transmittances of lens elements of the projection optical system, a dummy light-exposed substrate having a high reflectance is required in order to ensure the amount of light reflected by the dummy light-exposed substrate. To meet this need, at least two types of dummy light-exposed substrates having different reflectances must be prepared.

During dummy light-exposure, a liquid film is formed between the dummy light-exposed substrate and the projection optical system. When the dummy light-exposed substrate leaves the region where the liquid film is present (immersed region) after the end of the dummy light-exposure, it is desirable to inhibit the generation of any liquid residue in the liquid repellent region 20 on the surface of the dummy light-exposed substrate immediately after the leaving in order to prevent the liquid from spilling out. If the dummy light-exposed substrate rapidly leaves the immersed region, a liquid residue may be generated in the liquid repellent region 20. To avoid this situation, it is necessary to limit the speed at which the dummy light-exposed substrate leaves the immersed region. Furthermore, to prevent the liquid remaining in the lyophilic region 10 from spilling out onto, for example, the substrate stage 174 immediately after the dummy light-exposed substrate leaves the immersed region, it is necessary to limit the transport speed of the dummy light-exposed substrate during the period from the leaving until the recovery of the dummy light-exposed substrate 30.

As described above, from the viewpoint of preventing the liquid in the immersion exposure apparatus from spilling out, it is necessary to slow down the speed at which the dummy light-exposed substrate 30 leaves the immersed region, and the transport speed of the dummy light-exposed substrate 30 during the period from the leaving until the recovery of the dummy light-exposed substrate 30. However, slowdowns in these speeds result in prolongation of the time taken from the dummy light-exposure until the measurement of the imaging characteristics. A change in the temperature of the projection optical system during this time may make the thermal state of the projection optical system at the measurement stage different from that during the dummy light-exposure, degrading the reproducibility. To avoid this situation, it is necessary to set leaving and transport speeds that are as high as possible and yet low enough to prevent the liquid from spilling out.

The leaving and transport speeds can be determined by tests using a real machine. During the tests, dummy light-exposure can be performed for a dummy light-exposed substrate using pure water as an immersion liquid, and the behaviors of the liquid on the substrate can be observed while changing the leaving and transport speeds. At this time, as the leaving speed is raised above a certain threshold, a liquid residue may be generated in the outer second liquid repellent region 24 immediately after the leaving, as illustrated in FIG. 3. If a liquid residue is generated in the outer second liquid repellent region 24 immediately after the leaving, the liquid is expected to spill out from the dummy light-exposed substrate in the process of transport immediately after the generation of a liquid residue. Therefore, a leaving speed at which a liquid residue is generated in at least the outer second liquid repellent region 24 immediately after the leaving is inappropriate.

The transport speed must be determined to satisfy a condition in which no liquid residue is generated in at least the outer second liquid repellent region 24 as the dummy light-exposed substrate comes to rest after the end of the transport of the dummy light-exposed substrate.

Figure 5:
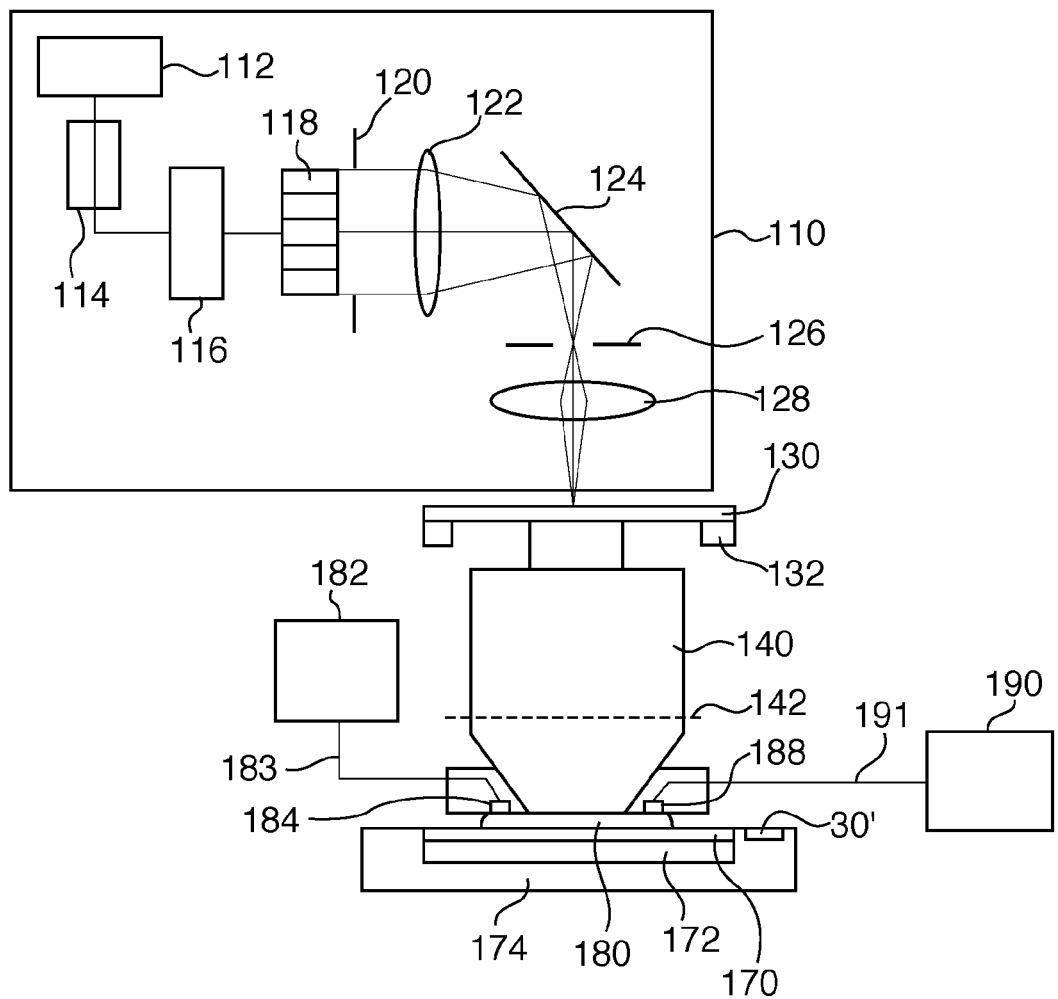
FIG. 5 is a view showing the schematic arrangement of an immersion exposure apparatus according to the second embodiment of the present invention.

FIG. 5 is a view showing the schematic arrangement of an immersion exposure apparatus according to the second embodiment of the present invention. The same reference numerals as in the constituent elements of the immersion exposure apparatus 100 shown in FIG. 1 denote virtually the same constituent elements in FIG. 5. An immersion exposure apparatus 100' according to the second embodiment of the present invention includes a dummy light-exposed member 30' arranged on a substrate stage 174. The dummy light-exposed member 30' can have the same configuration as the dummy light-exposed substrate 30 shown in FIG. 2A. That is, the dummy light-exposed member 30' can include a lyophilic region 10 and a liquid repellent region 20 which surrounds the lyophilic region 10. The liquid repellent region 20 can include a first liquid repellent region 22 which surrounds the lyophilic region 10, and a second liquid repellent region 24 which surrounds the first liquid repellent region 22. Note that the second liquid repellent region 24 has a liquid repellency higher than the first liquid repellent region 22. The substrate stage 174 can be configured to exchangeably mount the dummy light-exposed member 30'. For example, the substrate stage 174 can include a chucking mechanism which holds the dummy light-exposed member 30'.

A device manufacturing method according to an embodiment of the present invention is suitable for manufacturing, for example, a semiconductor device and a liquid crystal device. The device manufacturing method can include, for example, a dummy light-exposure step, a step of transferring the pattern of an original onto a photoresist applied on a substrate using an immersion exposure apparatus such as the above-mentioned immersion exposure apparatus 100', and a step of developing the photoresist. The devices are manufactured by further other known steps (e.g., etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-150842, filed Jun. 9, 2008, which is hereby incorporated by reference herein in its entirety.

What is claimed is:

1. A dummy light-exposed substrate used for dummy light-exposure in an immersion exposure apparatus which exposes a substrate to light via a projection optical system and a liquid, the dummy light-exposed substrate comprising:
    a lyophilic region; and
    a liquid repellent region surrounding the lyophilic region, wherein
    the liquid repellent region includes
        a first liquid repellent region surrounding the lyophilic region, and
        a second liquid repellent region surrounding the first liquid repellent region, and
    the second liquid repellent region having a liquid repellency higher than the first liquid repellent region.

2. The dummy light-exposed substrate according to claim 1, wherein the lyophilic region is a part of a surface of a silicon substrate having an antireflection coating formed on the surface thereof, the first liquid repellent region is made of a hexamethyldisilane (HMDS) film and is formed on the surface of the silicon substrate so as to surround the lyophilic region on the surface of the silicon substrate, and the second repellent region is made of a resist film having a liquid repellency higher than the hexamethyldisilane (HMDS) film and is formed on the hexamethyldisilane (HMDS) film so as to surround the first liquid repellent region on the surface of the silicon substrate.

3. A method of manufacturing a dummy light-exposed substrate used for dummy light-exposure in an immersion exposure apparatus which exposes a substrate to light via a projection optical system and a liquid, the method comprising the steps of:
    forming a first liquid repellent film on a surface of a base member;
    forming a second liquid repellent film having a liquid repellency higher than the first liquid repellent film on the first liquid repellent film;
    partially exposing the first liquid repellent film by forming a first opening whose boundary is defined by a closed figure in the second liquid repellent film; and
    partially exposing the surface by forming a second opening whose boundary is defined by a closed figure in the exposed portion of the first liquid repellent film.

4. The method according to claim 3, wherein the first liquid repellent film includes a hexamethyldisilane (HMDS) film, and the second liquid repellent film includes a resist film having a liquid repellency higher than the hexamethyldisilane (HMDS) film.

5. The method according to claim 4, wherein in the step of partially exposing the antireflection coating, the second opening is formed by exposing to light a region in which the second opening is to be formed on the hexamethyldisilane (HMDS) film.

* * * * *